United States Patent
Lee

(10) Patent No.: US 8,570,062 B2
(45) Date of Patent: Oct. 29, 2013

(54) EMI SHIELDING CIRCUIT AND SEMICONDUCTOR INTEGRATED CIRCUIT INCLUDING THE SAME

(75) Inventor: Jun Ho Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/340,885

(22) Filed: Dec. 30, 2011

(65) Prior Publication Data

US 2013/0127509 A1  May 23, 2013

(30) Foreign Application Priority Data

Nov. 21, 2011 (KR) .................. 10-2011-0121702

(51) Int. Cl.
*H03K 17/16* (2006.01)
*H03K 19/003* (2006.01)

(52) U.S. Cl.
USPC ................................. 326/27; 326/30; 326/21

(58) Field of Classification Search
None
See application file for complete search history.

(56) References Cited

U.S. PATENT DOCUMENTS 5,792,068 A * 8/1998 Bowman et al. ............... 600/536
2004/0243193 A1 * 12/2004 Ballis ............................... 607/27

FOREIGN PATENT DOCUMENTS

KR  10-2010-0041390 A  4/2010

* cited by examiner

*Primary Examiner* — Jany Richardson
(74) *Attorney, Agent, or Firm* — William Park & Associates Patent Ltd.

(57) ABSTRACT

An electromagnetic interference (EMI) shielding circuit and a semiconductor integrated circuit including the same are provided. The EMI shielding circuit includes a data level comparison unit, a control signal generation unit, and a driver for EMI cancellation. The data level comparison unit generates a data comparison signal by comparing a number of high-level data transmitted through a plurality of data lines and a number of low-level data transmitted through the plurality of data lines. The control signal generation unit generates a driving control signal in response to the data comparison signal. The driver for EMI cancellation outputs an EMI cancellation signal in response to the driving control signal.

16 Claims, 3 Drawing Sheets

EMI SHIELDING CIRCUIT AND SEMICONDUCTOR INTEGRATED CIRCUIT INCLUDING THE SAME

CROSS-REFERENCES TO RELATED APPLICATION

The present application claims priority under 35 U.S.C. §119(a) to Korean application number 10-2011-0121702 filed on Nov. 21, 2011 in the Korean Intellectual Property Office, which is incorporated by reference in its entirety.

BACKGROUND

1. Technical Field

The present invention relates to a semiconductor integrated circuit, and more particularly, to an EMI shielding circuit.

2. Related Art

As semiconductor integrated circuits are highly integrated and operated at a high speed, electromagnetic waves are generated by the electrical signals propagating inside the semiconductor integrated circuits. Interference due to these electromagnetic waves, or electromagnetic interference (EMI), may affect operation of the semiconductor integrated circuits and other circuits.

Furthermore, as semiconductor memory devices are highly integrated and operated at a high speed, EMI is induced in the semiconductor memory devices and external circuits due to electromagnetic waves generated by electric signals of the semiconductor memory devices in data input/output operations of the semiconductor memory devices. Therefore, a semiconductor memory device for storing data and outputting the stored data and a semiconductor integrated circuit including the same should include an EMI shielding circuit.

The EMI shielding circuit uses methods including spread spectrum clocking (SSC), differential signaling, etc. However, the effective timing period of a signal is decreased when using the SSC, and the area of a circuit is increased in the differential signaling.

SUMMARY

An EMI shielding circuit capable of shielding electromagnetic waves generated according to the level of data is described.

In one embodiment of the present invention, an electromagnetic interference (EMI) shielding circuit includes a data level comparison unit configured to generate a data comparison signal by comparing a number of high-level data transmitted through a plurality of data lines and a number of low-level data transmitted through the plurality of data lines, a control signal generation unit configured to generate a driving control signal in response to the data comparison signal, and a driver for EMI cancellation configured to output an EMI cancellation signal in response to the driving control signal.

In another embodiment of the present invention, a semiconductor integrated circuit includes a data driving unit configured to drive data transmitted through a plurality of data lines, and an EMI shielding circuit configured to compare the number of high-level data transmitted through the plurality of data lines and the number of low-level data transmitted through the plurality of data lines, and output an EMI cancellation signal having a level opposite to that of data having a greater number.

Another embodiment of the present invention includes a method of generating a data comparison signal by comparing a number of high-level data transmitted through a plurality of data lines and a number of low-level data transmitted through the plurality of data lines, generating a driving control signal in response to the data comparison signal, and generating an EMI cancellation signal in response to the driving control signal.

BRIEF DESCRIPTION OF THE DRAWINGS

Features, aspects, and embodiments are described in conjunction with the attached drawings.

DETAILED DESCRIPTION

An EMI shielding circuit and a semiconductor integrated circuit including the same will be described below with reference to the accompanying drawings through exemplary embodiments of the invention.

Figure 1:
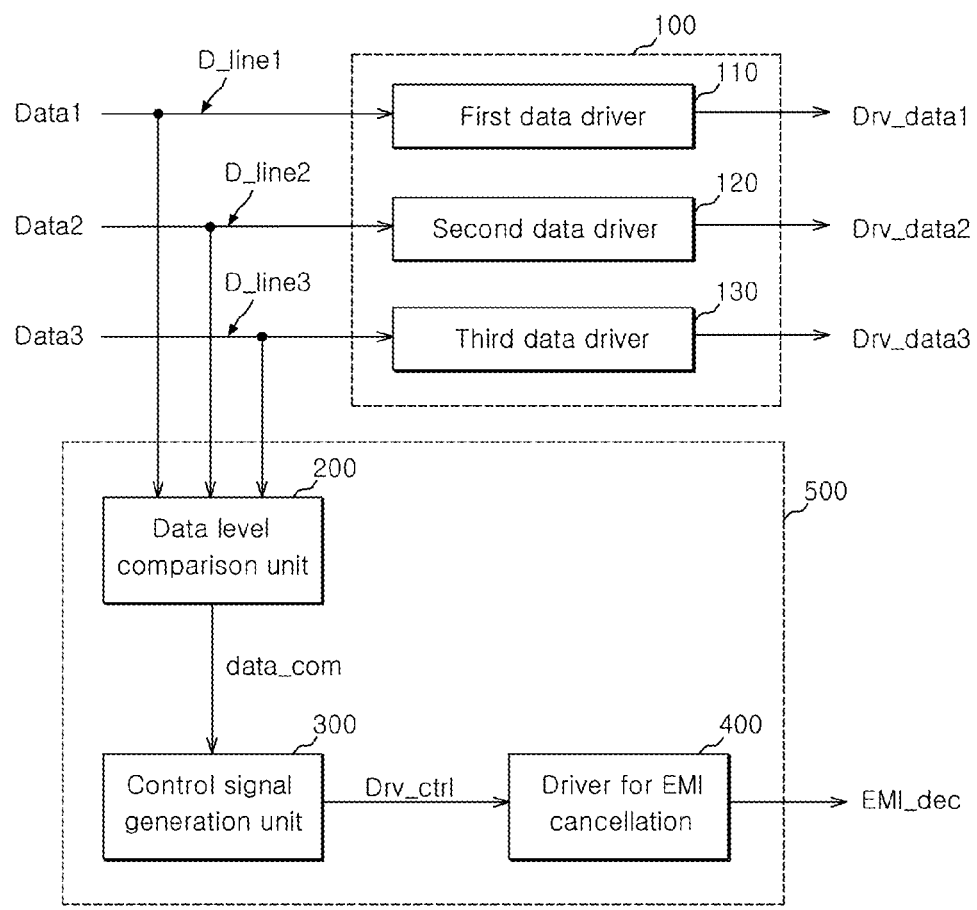
FIG. 1 is an exemplary configuration diagram of a semiconductor integrated circuit according to an embodiment of the invention.

A semiconductor integrated circuit according to one embodiment includes, as illustrated in FIG. 1, first to third data lines D_line1, D_line2, and D_line3, a data driving unit 100, and an EMI shielding circuit 500.

The first data line D_line1 is a line through which first data Data1 is transmitted.

The second data line D_line2 is a line through which second data Data2 is transmitted.

The third data line D_line3 is a line through which third data Data3 is transmitted.

The data driving unit 100 drives data respectively transmitted through the first to third data lines D_line1, D_line2, and D_line3, i.e., the first to third data Data1, Data2, and Data 3, and outputs the driven data Drv_data1, Drv_data2, and Drv_data3.

The data driving unit 100 includes first to third data drivers 110, 120, and 130.

The first data driver 110 drives the first data Data1 transmitted through the first data line D-line1 and outputs the driven data Drv_data1.

The second data driver 120 drives the second data Data2 transmitted through the second data line D-line2 and outputs the driven data Drv_data2.

The third data driver 130 drives the third data Data3 transmitted through the third data line D-line3 and outputs the driven data Drv_data3.

The EMI shielding circuit 500 compares the number of high-level data transmitted through the first to third data lines D_line1, D_line2, and D_line3 and the number of low-level data transmitted through the first to third data lines D_line1, D_line2, and D_line3, and outputs an EMI cancellation signal EMI_dec having the level of data with a large number and the level of data with a small number.

The EMI shielding circuit 500 includes a data level comparison unit 200, a control signal generation unit 300, and a driver 400 for EMI cancellation.

The data level comparison unit 200 generates a data comparison signal data_com by comparing the number of high-level data transmitted through the first to third data lines D_line1, D_line2 and D_line3 and the number of low-level data transmitted through the first to third data lines D_line1, D_line2 and D_line3.

The control signal generation unit 300 generates a driving control signal Drv_ctrl in response to the data comparison signal data_com.

The driver 400 for EMI cancellation outputs the EMI cancellation signal EMI_dec in response to the driving control signal Drv_ctrl.

Figure 2:
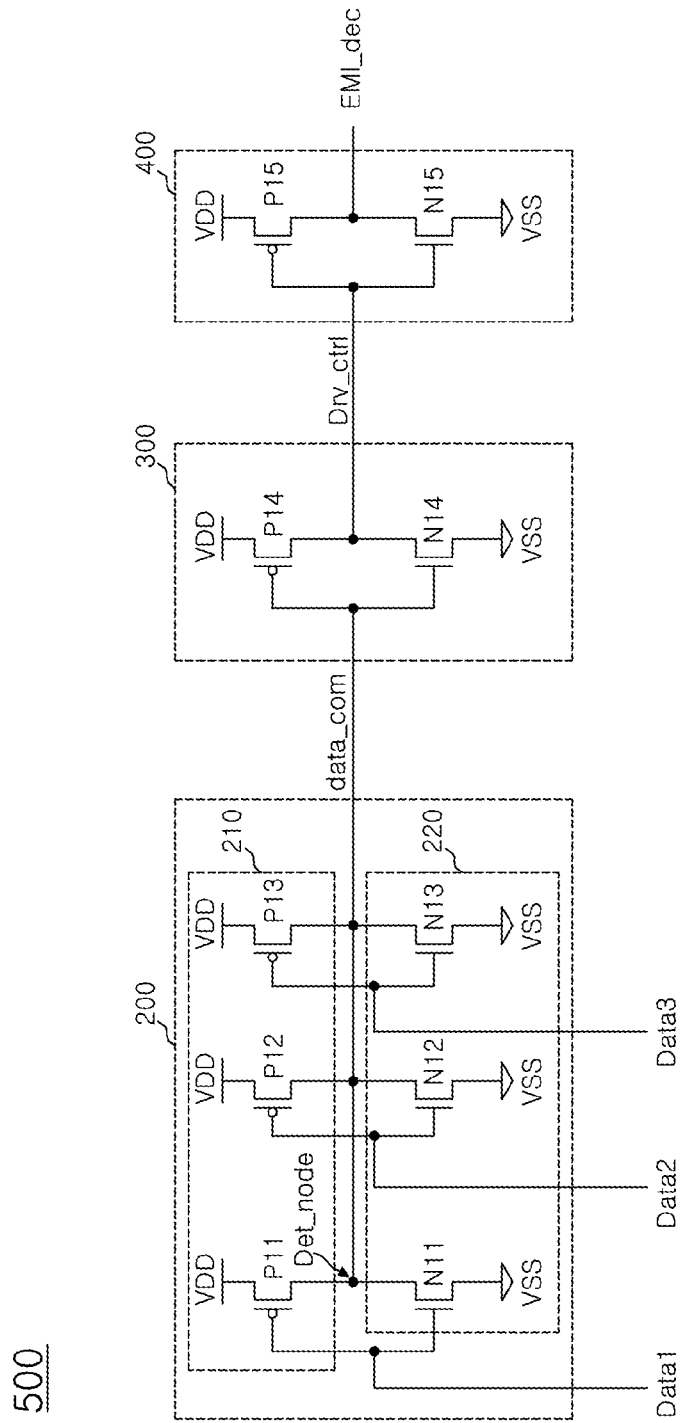
FIG. 2 is an exemplary configuration diagram of an EMI shielding circuit of FIG. 1.

As illustrated in FIG. 2, the data level comparison unit 200 varies a voltage level of a detection node Det_node according to the number of high-level data transmitted through the first to third data lines D_line1, D_line2, and D_line3 and the number of low-level data transmitted through the first to third data lines D_line1, D_line2, and D_line3. In this case, the voltage level of the detection node Det_node is a voltage level of the data comparison signal data_com.

The data level comparison unit 200 includes a detection node pull-up unit 210 and a detection node pull-down unit 220.

The detection node pull-up unit 210 is connected to the first to third data lines D_line1, D_line2, and D_line 3 so as to pull up the voltage level of the detection node Det_node when the first to third data Data1, Data2, and Data 3 respectively transmitted through the first to third data lines D_line1, D_line2, and D_line3 have low levels.

The detection node pull-up unit 210 includes first to third transistors P11, P12, and P13. The first transistor P11 has a gate to which the first data Data1 is inputted, a source to which an operation voltage, e.g., external voltage VDD is applied, and a drain to which the detection node Det_node is connected. The second transistor P12 has a gate to which the second data Data2 is inputted, a source to which an operation voltage, e.g., external voltage VDD is applied, and a drain to which the detection node Det_node is connected. The third transistor P13 has a gate to which the third data Data3 is inputted, a source to which an operation voltage, e.g., external voltage VDD is applied, and a drain to which the detection node Det_node is connected.

The detection node pull-down unit 220 is connected to the first to third data lines D_line1, D_line2, and D_line3 so as to pull down the voltage level of the detection node Det_node when the first to third data Data1, Data2, and Data 3 respectively transmitted through the first to third data lines D_line1, D_line2, and D_line3 have high levels.

The detection node pull-down unit 220 includes fourth to sixth transistors N11, N12, and N13. The fourth transistor N11 has a gate to which the first data Data1 is inputted, a drain to which the detection node Det_node is connected, and a source to which a ground terminal VSS is connected. The fifth transistor N12 has a gate to which the second data Data2 is inputted, a drain to which the detection node Det_node is connected, and a source to which the ground terminal VSS is connected. The sixth transistor N13 has a gate to which the third data Data3 is inputted, a drain to which the detection node Det_node is connected, and a source to which the ground terminal VSS is connected.

The control signal generation unit 300 generates the driving control signal Drv_ctrl using the voltage at the detection node Det_node, i.e., the data comparison signal data_com.

The control signal generation unit 300 includes seventh and eighth transistors P14 and N14. The seventh transistor P14 has a gate to which the data comparison signal data_com is inputted and a source to which an operation voltage, i.e., external voltage VDD. The eighth transistor N14 has a gate to which the data comparison signal data_com is inputted, a source to which the ground terminal VSS is connected, and a drain to which a drain of the seventh transistor P14 is connected. In this case, the driving control signal Drv_ctrl is outputted at a node to which the seventh and eighth transistors P14 and N14 are connected.

The driver 400 for EMI cancellation has impedance greater than the impedance of the first to third data drivers 110, 120, and 130. The driver 400 for EMI cancellation outputs the EMI cancellation signal EMI_dec by performing a driving operation in response to the driving control signal Drv_ctrl.

The driver 400 for EMI cancellation includes ninth and tenth transistors P15 and N15. The ninth transistor P15 has a gate to which the driving control signal Drv_ctrl is inputted and a source to which an operation voltage, e.g., external voltage VDD is applied. The tenth transistor N15 has a gate to which the driving control signal Drv_ctrl is inputted, a source to which the ground terminal VSS is connected, and a drain to which a drain of the ninth transistor P15 is connected. In this case, the EMI cancellation signal EMI_dec is outputted at a node to which the ninth and tenth transistors P15 and N15 are connected. The operation voltage of the data level comparison unit 200, the control signal generation unit 300, and the driver 400 for EMI cancellation, included in the EMI shielding circuit 500, can be generated using the same voltage source for generating the operation voltage of the first to third data drivers 110, 120, and 130. Meanwhile, the operation voltage of one or two of the components constituting the EMI shielding circuit 500 can be generated using the same voltage source for generating the operation voltage of the first to third data drivers 110, 120, and 130.

The EMI shielding circuit and the semiconductor integrated circuit using the same configured as described above operate as follows.

As one example, the first and second data Data1 and Data2 respectively transmitted through the first and second data lines D_line1 and D_line2 have high levels and the third data Data3 transmitted through the third data line D_line3 has a low level. That is, it is assumed that the number of high-level data transmitted through the first to third data lines D_line1, D_line2, and D_line3 is two and the number of low-level data transmitted through the first to third data lines D_line1, D_line2, and D_line3 is one.

The number of transistors for pulling up the detection node among the three transistors P11, P12, and P13 constituting the detection node Det_node pull-up unit 210 of the data level comparison unit 200 is one, i.e., the transistor P13. The number of transistors for pulling down the detection node Det_node among the three transistors N11, N12, and N13 constituting the detection node pull-down unit 220 of the data level comparison unit 200 is two, i.e., the transistors N11 and N12. Therefore, the detection node Det_node is more influenced by a pull-down driving force than a pull-up driving force, and hence the voltage level of the detection node Det_node is decreased. That is, when the number of high-level data is greater than that of low-level data, the data level comparison unit 200 decreases the voltage level of the data comparison signal data_com.

If the voltage level of the data comparison signal data_com is lowered, the control signal generation unit 300 outputs a driving control signal Drv_ctrl that has a high level.

The driver 400 for EMI cancellation receives the driving control signal Drv_ctrl that has the high level so as to output an EMI cancellation signal EMI_dec that has a low level.

That is, when the number of high-level data is greater than that of low-level data among the data outputted through the first to third data drivers 110, 120 and 130, the EMI cancellation signal EMI_dec that has the low level is generated and outputted.

As another example, the first and second data Data1 and Data2 respectively transmitted through the first and second data lines D_line1 and D_line2 have low levels and the third data Data3 transmitted through the third data line D_line3 has a high level. That is, it is assumed that the number of high-level data transmitted through the first to third data lines D_line1, D_line2, and D_line3 is one and the number of low-level data transmitted through the first to third data lines D_line1, D_line2, and D_line3 is two.

The number of transistors for pulling up the detection node among the three transistors P11, P12 and P13 constituting the detection node Det_node pull-up unit 210 of the data level comparison unit 200 is two, i.e., the transistors P11 and P12. The number of transistors for pulling down the detection node Det_node among the three transistors N11, N12 and N13 constituting the detection node pull-down unit 220 of the data level comparison unit 200 is one, i.e., the transistor N13. Therefore, the detection node Det_node is more influenced by the pull-up driving force rather than the pull-down driving force, and hence the voltage level of the detection node Det_node is increased. That is, when the number of low-level data is greater than that of high-level data, the data level comparison unit 200 increases the voltage level of the data comparison signal data_com.

If the voltage level of the data comparison signal data_com is increased, the control signal generation unit 300 outputs a driving control signal Drv_ctrl that has a low level.

The driver 400 for EMI cancellation receives the driving control signal Drv_ctrl that has the low level so as to output an EMI cancellation signal EMI_dec that has a high level.

Figure 3:
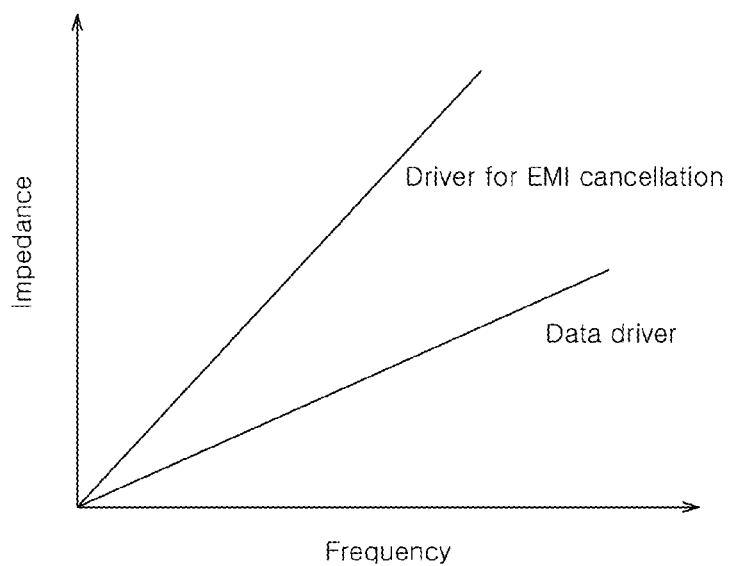
FIG. 3 is a graph comparing impedances of a data driver and a driver for EMI cancellation with respect to frequencies.

That is, when the number of low-level data is greater than that of high-level data among the data outputted through the first to third data drivers 110, 120, and 130, the EMI cancellation signal EMI_dec that has the high level is generated and outputted. In this case, the impedance of the driver 400 for EMI cancellation is greater than that of the first to third data drivers 110, 120, and 130. As illustrated in FIG. 3, the impedance of the driver 400 for EMI cancellation can be increased as the operation speed of the semiconductor integrated circuit is increased.

According to at least these embodiments, the EMI shielding circuit decides whether the number of high-level data is greater than that of low-level data by comparing levels of data, and is configured so that a driver for EMI cancellation having impedance greater than that of a data driver for driving data drives a low-level output when the number of high-level data is greater than that of low-level data, thereby cancelling EMI generated according to the output level of the data. Further, when the number of low-level data is greater than that of high-level data, the driver for EMI cancellation drives an outputs signal a high level, thereby canceling EMI generated according to the output level of the data.

The EMI shielding circuit can shield electromagnetic waves generated inside of the semiconductor integrated circuit, and accordingly, it is possible to reduce malfunction of the semiconductor integration circuit and its external circuit due to EMI. While only 3 data bits have been used, various embodiments of the invention may be used for any number of data bits.

While certain embodiments have been described above, it will be understood to those skilled in the art that the embodiments described are by way of example only. Accordingly, the circuit described herein should not be limited based on the described embodiments. Rather, the circuit described herein should only be limited in light of the claims that follow when taken in conjunction with the above description and accompanying drawings.

What is claimed is:

1. An electromagnetic interference (EMI) shielding circuit, comprising:
a data level comparison unit configured to generate a data comparison signal by comparing a number of high-level data transmitted through a plurality of data lines and a number of low-level data transmitted through the plurality of data lines;
a control signal generation unit configured to generate a driving control signal in response to the data comparison signal; and
a driver for EMI cancellation configured to output an EMI cancellation signal in response to the driving control signal.

2. The EMI shielding circuit according to claim 1, wherein the data level comparison unit varies a voltage level of a detection node according to the number of high-level data transmitted through the plurality of data lines and the number of low-level data transmitted through the plurality of data lines, and the voltage level of the detection node is a voltage level of the data comparison signal.

3. The EMI shielding circuit according to claim 2, wherein the data level comparison unit comprises:
a detection node pull-up unit configured to be connected to the plurality of data lines so as to pull up the voltage level of the detection node for each of the data transmitted through the plurality of data lines that has a low level; and
a detection node pull-down unit configured to be connected to the plurality of data lines so as to pull down the voltage level of the detection node for each of the data transmitted through the plurality of data lines that has a high level.

4. The EMI shielding circuit according to claim 3, wherein the detection node pull-up unit comprises a plurality of transistors each having a gate to which a corresponding data line of the plurality of data lines is connected, a source to which an operation voltage is applied, and a drain to which the detection node is connected.

5. The EMI shielding circuit according to claim 3, wherein the detection node pull-down node comprises a plurality of transistors each having a gate to which a corresponding data line of the plurality of data lines is connected, a source to which a ground terminal is connected, and a drain to which the detection node is connected.

6. The EMI shielding circuit according to claim 2, wherein the control signal generation unit generates the driving control signal using the voltage level of the detection node.

7. A semiconductor integrated circuit, comprising:
a data driving unit configured to drive data, wherein the data is transmitted to the data driving unit through a plurality of data lines; and
an EMI shielding circuit configured to compare the number of high-level data transmitted through the plurality of data lines and the number of low-level data transmitted through the plurality of data lines, and output an EMI cancellation signal having a level opposite to that of data having a larger number.

8. The semiconductor integrated circuit according to claim 7, wherein the data driving unit comprises a plurality of data drivers for respectively driving the data transmitted through the plurality of data lines.

9. The semiconductor integrated circuit according to claim 7, wherein the EMI shielding circuit comprises:
a data level comparison unit configured to compare the number of high-level data transmitted through the plurality of data lines and the number of low-level data transmitted through the plurality of data lines;

a control signal generation unit configured to drive a control output in response to the data level comparison unit output; and a driver for EMI cancellation configured to output the EMI cancellation signal in response to the output of the control signal generation unit.

10. The semiconductor integrated circuit according to claim 9, wherein the data level comparison unit comprises:

a detection node pull-up unit configured to pull up a voltage level of a detection node when the low-level data is inputted; and a detection node pull-down unit configured to pull down the voltage level of the detection node when the high-level data is inputted.

11. The semiconductor integrated circuit according to claim 10, wherein the control signal generation unit drives the control output in response to the voltage level of the detection node.

12. The semiconductor integrated circuit according to claim 11, wherein the driver for EMI cancellation has impedance greater than the data driver.

13. The semiconductor integrated circuit according to claim 12, wherein the impedance of the driver for EMI cancellation increases as the operating speed of the semiconductor integrated circuit increases.

14. A method comprising:

generating a data comparison signal by comparing a number of high-level data transmitted through a plurality of data lines and a number of low-level data transmitted through the plurality of data lines;

generating a driving control signal in response to the data comparison signal; and generating an EMI cancellation signal in response to the driving control signal.

15. The method according to claim 14, wherein a voltage level of a detection node varies according to the number of high-level data transmitted through the plurality of data lines and the number of low-level data transmitted through the plurality of data lines, and the voltage level of the detection node is a voltage level of the data comparison signal.

16. The method according to claim 15, wherein the voltage level of the detection node is pulled up in response to each of the low level data, and the voltage level of the detection node is pulled up in response to each of the low level data.

* * * * *